United States Patent
Ohsaka et al.

(10) Patent No.: US 6,778,572 B1
(45) Date of Patent: Aug. 17, 2004

(54) ELECTRODE STRUCTURE, PROCESS FOR FABRICATING ELECTRODE STRUCTURE AND SEMICONDUCTOR LIGHT-EMITTING DEVICE

(75) Inventors: Shigeo Ohsaka, Yamanashi-ken (JP); Shinichi Domoto, Yamanashi-ken (JP); Nobumasa Okada, Yamanashi-ken (JP)

(73) Assignee: Fujitsu Quantum Devices Limited, Yamanashi-ken (JP)

( * ) Notice: Subject to any disclaimer, the term of this patent is extended or adjusted under 35 U.S.C. 154(b) by 0 days.

(21) Appl. No.: 09/456,531

(22) Filed: Dec. 8, 1999

(30) Foreign Application Priority Data

Mar. 18, 1999 (JP) .......................................... 11-073500

(51) Int. Cl.[7] .............................. H01S 5/00; H01L 29/40
(52) U.S. Cl. ........................... 372/43; 372/87; 257/753; 257/759
(58) Field of Search ............................... 372/50, 43–44, 372/45–46; 257/81, 99, 753, 759

(56) References Cited

U.S. PATENT DOCUMENTS

| | | | | |
|---|---|---|---|---|
| 4,519,678 A | * | 5/1985 | Komatsubara et al. | 349/160 |
| 4,938,569 A | * | 7/1990 | Tsunoda et al. | 349/106 |
| 5,124,781 A | * | 6/1992 | Tashiro | 257/759 |
| 5,155,576 A | * | 10/1992 | Mizushima | 257/759 |
| 5,294,504 A | * | 3/1994 | Otagawa et al. | 429/213 |
| 5,796,714 A | * | 8/1998 | Chino et al. | 372/50 |
| 5,841,151 A | | 11/1998 | Sahara | 257/14 |
| 6,150,725 A | * | 11/2000 | Misawa et al. | 257/781 |
| 6,166,439 A | * | 12/2000 | Cox | 257/758 |
| 6,201,825 B1 | * | 3/2001 | Sakurai et al. | 372/96 |
| 6,226,310 B1 | * | 5/2001 | Takagi et al. | 372/50 |
| 6,274,923 B1 | * | 8/2001 | Mikagi | 257/642 |

FOREIGN PATENT DOCUMENTS

| | | |
|---|---|---|
| JP | 62-205648 | 9/1987 |
| JP | 63-188959 | 8/1988 |
| JP | 4-98841 | 3/1992 |
| JP | 6-91126 | 11/1994 |
| JP | 11-68253 | 3/1999 |

* cited by examiner

*Primary Examiner*—Don Wong
*Assistant Examiner*—James Menefee
(74) *Attorney, Agent, or Firm*—Armstrong, Kratz, Quintos, Hanson & Brooks, LLP

(57) ABSTRACT

An electrode structure includes a conductive film 24c formed on a base substrate 10 through an insulation film. The insulation film comprises a plurality of poles 36 of polyimide, a first film 38 formed on the side surfaces of the poles and formed of an insulation material of a high hardness than polyimide, and a second film 40 of polyimide buried among the plural poles with the first film formed on the side surfaces thereof. Because of the first film of an insulation material having high hardness formed on the side surfaces of the poles of polyimide, even when a strong force is applied upon the bonding, the poles are prevented from being distorted, and the conductive film is protected from peeling off. Because of the thick polyimide layer below the conductive film, a parasitic capacity between the conductive film and the lower layer can be small, whereby radio-frequency signals can be used.

11 Claims, 14 Drawing Sheets

ELECTRODE STRUCTURE, PROCESS FOR FABRICATING ELECTRODE STRUCTURE AND SEMICONDUCTOR LIGHT-EMITTING DEVICE

BACKGROUND OF THE INVENTION

The present invention relates to an electrode structure, a process for fabricating the electrode structure and a semiconductor light-emitting device, more specifically an electrode structure having a parasitic capacity reduced with respect to a lower layer, a process for fabricating the electrode structure and a semiconductor light-emitting device.

These days, optical communication using semiconductor lasers, which enable high-speed and large-capacity information transmission, having been noted. A semiconductor laser generally has a structure including electrodes formed respectively on the upper sides and the back sides of the devices. Bonding pads are connected to the electrodes on the upper sides, and bonding wires are connected to the bonding pads. Modulation signals are supplied to the modulator region of the semiconductor laser.

Recently, further increase of the communication speed is required to meet larger capacities for information processing amounts. For higher communication speed it is necessary to use signal of radio-frequencies as the modulation signals.

However, in order that the modulation signals further have radio-frequencies, parasitic capacities between the bonding pads and the lower layer must be decreased. Delays in rises and falls of waveforms are caused corresponding to parasitic capacities between the bonding pads and the lower layer. In a case that the modulation signals have radio-frequencies, response delays due to parasitic capacities between the bonding pads and the lower layer become unnegligible.

In order to decrease parasitic capacities between the bonding pads and the lower layer it is proposed that the bonding pads have small areas. The bonding pads have small areas, whereby parasitic capacities between the bonding pads and the lower layer can be small.

However, there is a limitation to decreasing the bonding pad area. That is, the bonding pads requires a certain area for the bonding wires to be jointed to the bonding pads. When an area for the bonding is taken into account, the bonding pads cannot be made smaller than a certain area. Resultantly, parasitic capacities between the bonding pads and the lower layer cannot be decreased to about 1 pF. In a case of 1 pF, a modulation frequency could be increased to only about 2.5 GHz. Recently, the modulation speed is required to be increased to about 10 GHz. However, the modulation speed increase to about 10 GHz cannot be attained by decreasing the bonding pad area.

SUMMARY OF THE INVENTION

An object of the present invention is to provide an electrode structure which enables decrease of parasitic capacities with respect to a lower layer, a process for fabricating the electrode structure and a semiconductor light-emitting device using radio-frequencies.

In order to make a parasitic capacity between the bonding pads and a lower layer small it is proposed that a thick insulation film is formed below the bonding pads.

However, in a case that silicon oxide film or others is formed thick below the bonding pads, the silicon oxide film or others is broken due to a force applied upon the bonding, and the bonding pad peel off.

Then, it is proposed that polyimide layer, which is not broken easily even by a strong force and can be formed thick is formed below the bonding pads. It is considered that the polyimide layer will not be broken by impacts applied upon the bonding because polyimide is a material having high flexibility. A semiconductor laser including a polyimide layer formed thick below the bonding pads will be explained with reference to FIG. 14.

As shown in FIG. 14, a silicon nitride film 134 is formed on a substrate 110. A thick polyimide layer 136 is formed on the silicon nitride film 134. A silicon nitride film 138 is formed on the upper surface and the side surface of the polyimide layer 136.

In the semiconductor laser shown in FIG. 14, the silicon nitride films 134, 138 cover the backside surface, the side surface and the upper surface of the polyimide layer 136 because the polyimide layer 136 has low adhesion to the lower layer and has high hygroscopicity. In the semiconductor laser shown in FIG. 14, the polyimide layer 136 has the back side surface, and side surface and the upper surface covered with the silicon nitride films 134, 138, whereby the polyimide layer 136 can have good adhesion to the lower layer, and the polyimide layer 136 can be prohibited from absorbing water. A bonding pad 124 is formed on the silicon nitride film 138.

However, in a case that the polyimide layer 136 is formed below the bonding pad 124 as shown in FIG. 14, the polyimide layer 136 is distorted due to an impact which is as large as, e.g., 500 kg/cm$^2$ applied to the polyimide layer 136 upon the bonding. The silicon nitride film 138 is accordingly broken. Good adhesion cannot be obtained any more between the broken silicon nitride film 138 and the bonding pad 124. As a result, the bonding pad 124 peels off the silicon nitride film 138. Thus, simply forming the thick polyimide layer 136 below the bonding pad 124 cannot make the semiconductor laser reliable.

Then, the inventors of the present application made earnest studies and have obtained an idea of art that the polyimide layer formed thick can stand impacts applied upon the bonding.

The above-described object is achieved by an electrode structure including a conductive film formed on a base substrate through an insulation film, the insulation film comprising a plurality of poles of polyimide, a first film formed on side surfaces of the poles and formed of an insulation material having a higher hardness than polyimide, and a second film of polyimide buried among said a plurality of poles with the first film formed on the side surfaces thereof. Because of the first film of an insulation material having high hardness formed on the side surfaces of the poles of polyimide, even when a strong force is applied upon the bonding, the poles are prevented from being distorted, and the conductive film is protected from peeling off. Because of the thick polyimide layer below the conductive film, a parasitic capacity between the conductive film and the lower layer can be small, whereby radio-frequency signals can be used.

The above-described object is achieved by an electrode structure including a conductive film formed on a base substrate through an insulation film, the insulation film comprising a first film of polyimide having a plurality of openings which reach the base substrate, a second film formed on inside walls of the openings and formed of an insulation material having a higher hardness than polyimide, and a plurality of poles of polyimide buried in the openings with the second film formed on the inside walls thereof. Because of the second film of an insulation material of a high hardness is formed on the inside walls of the openings formed in the first film of polyimide, even when a strong force is applied upon the bonding, the first film are prevented from being distorted, and the conductive film is protected from peeling off. Because of the thick polyimide layer below the conductive film, a parasitic capacity between the conductive film and the lower layer can be small, whereby radio-frequency signals can be used.

The above-described object is achieved by a semiconductor light-emitting device having an electrode structure including a conductive film formed on a base substrate through an insulation film, the insulation film comprising a plurality of poles of polyimide, a first film formed on side surfaces of the poles and formed of an insulation material having a higher hardness than polyimide, and a second film of polyimide buried among said a plurality of poles with the first film formed on side surfaces thereof. Because of the first film of an insulation material of a high hardness formed on the side surfaces of the poles of polyimide, even when a strong force is applied upon the bonding, the poles are prevented from being distorted, and the conductive film is protected from peeling off. Because of the thick polyimide layer below the conductive film, a parasitic capacity between the conductive film and the lower layer can be small, whereby radio-frequency signals can be used.

The above-described object is achieved by a semiconductor light-emitting device having an electrode structure including a conductive film formed on a base substrate through an insulation film, the insulation film comprising a first film of polyimide having a plurality of openings which reach the base substrate, a second film formed on inside walls of the openings and formed of an insulation material having a higher hardness than polyimide, and a plurality of poles of polyimide buried in the openings with the second film formed on the inside walls thereof. Because of the second film of an insulation material of a high hardness formed on the inside walls of the openings formed in the first film of polyimide, even when a strong force is applied upon the bonding, the first film is prevented from being distorted, and the conductive film is protected from peeling off. Because of the thick polyimide layer below the conductive film, a parasitic capacity between the conductive film and the lower layer can be small, whereby radio-frequency signals can be used.

The above-described object is achieved by a process for fabricating an electrode structure including a step of forming an insulation film on a base substrate, and a step of forming a conductive film on the insulation film, the step of forming the insulation film comprising a step of forming a plurality of poles of polyimide on the base substrate, a step of forming on side surface of the poles a first film of an insulation material having a higher hardness than polyimide, and a step of burying a second film of polyimide among the first film. Because of the first film of an insulation material having high hardness formed on the side surfaces of the poles of polyimide, even when a strong force is applied upon the bonding, the poles are prevented from being distorted, and the conductive film is protected from peeling off. Because of the thick polyimide layer below the conductive film, a parasitic capacity between the conductive film and the lower layer can be small, whereby radio-frequency signals can be used.

The above-described object is achieved by a process for fabricating an electrode structure including a step of forming an insulation film on a base substrate and a step of forming a conductive film on the insulation film, the step of forming the insulation film comprising a step of forming on a base substrate a first film of polyimide having a plurality of openings which reach the base substrate, a second step of forming on inside walls of the openings a second film of an insulation material having a higher hardness than polyimide, and a step of forming a plurality of poles of polyimide buried in the openings with the second film formed on the inside walls thereof. Because of the second film of an insulation material of high hardness is formed on the inside walls of the openings formed in the first film of polyimide, even when a strong force is applied upon the bonding, the poles are prevented from being distorted, and the conductive film is protected from peeling off. Because of the thick polyimide layer below the conductive film, a parasitic capacity between the conductive film and the lower layer can be small, whereby radio-frequency signals can be used.

DETAILED DESCRIPTION OF THE INVENTION

A First Embodiment

Figure 1:
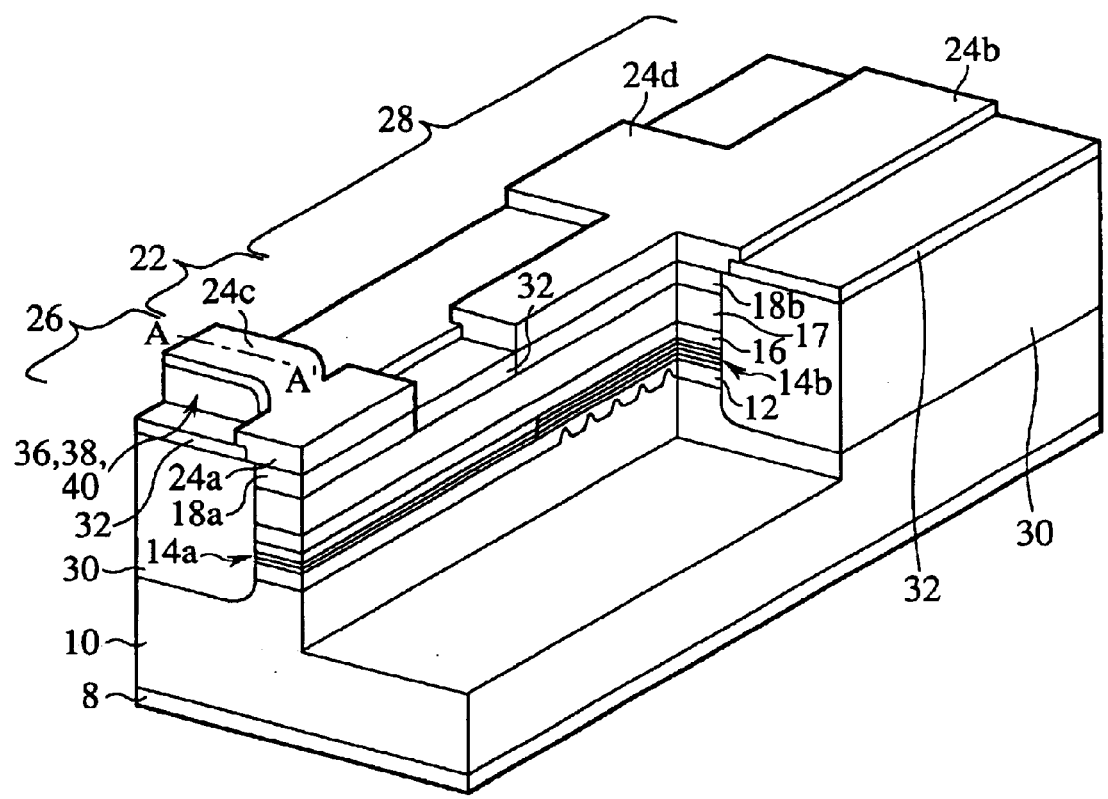
FIG. 1 is a perspective view of the semiconductor light-emitting device according to a first embodiment of the present invention.
Figure 2A:
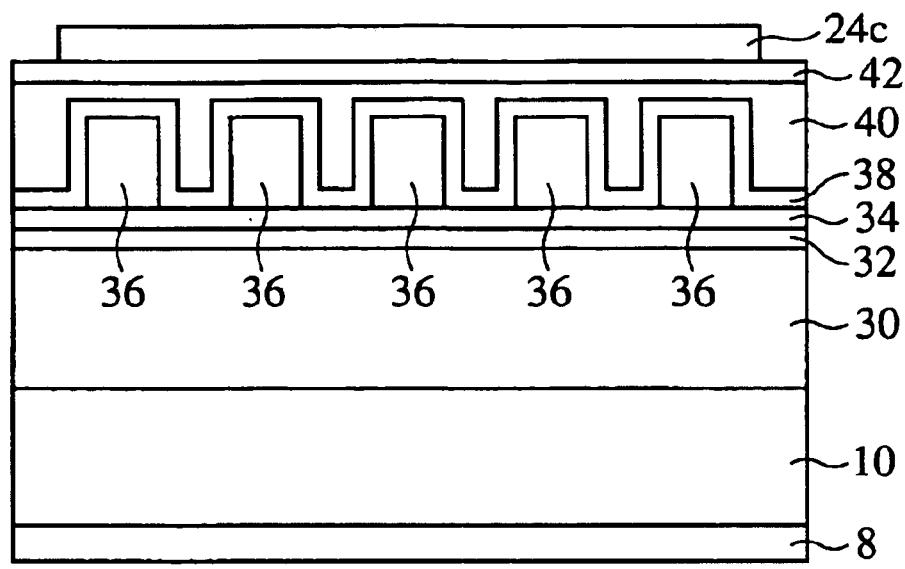
FIG. 2A is a sectional view of the semiconductor light-emitting device according to the first embodiment of the present invention, which shows a vicinity of the bonding pad.
Figure 2B:
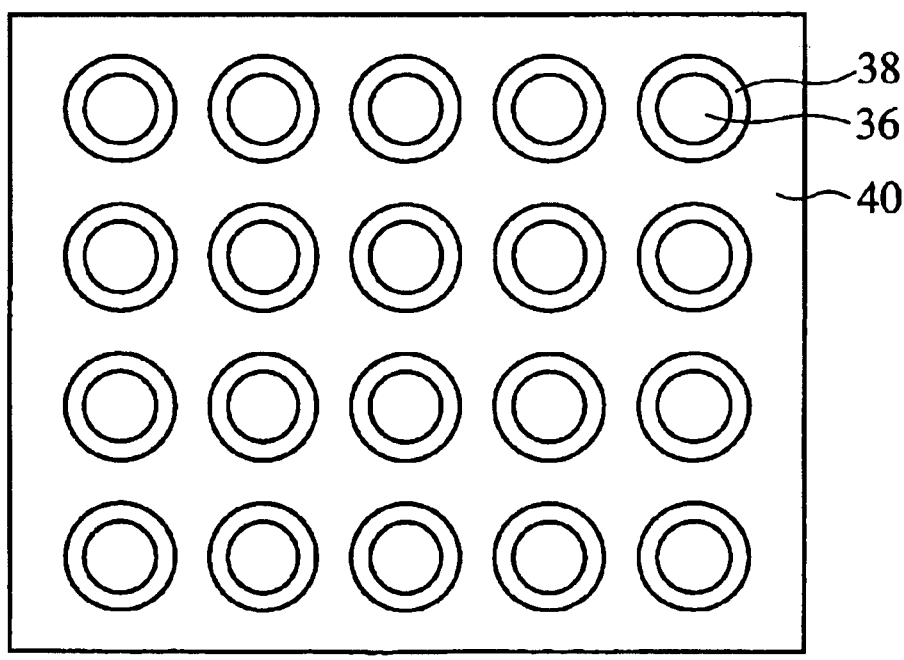
FIG. 2B is a plan view of the semiconductor light-emitting device according to the first embodiment of the present invention, which shows a vicinity of the bonding pad.

The semiconductor light-emitting device according to a first embodiment of the present invention will be explained with reference to FIGS. 1 to 5. FIG. 1 is a perspective view of the semiconductor light-emitting device according to the present embodiment. FIG. 2A is a sectional view of a vicinity of bonding pad, specifically along the line A—A' in FIG. 1. FIG. 2B is a plan view of the vicinity of the bonding pad. In FIG. 2B some constituent members are not shown. FIGS. 3A to 5 show sectional views of the semiconductor light-emitting device according to the present embodiment, which show the process for fabricating the semiconductor light-emitting device.

Semiconductor Light-emitting Device

First, the semiconductor light-emitting device according to the present embodiment will be explained with reference to FIG. 1. In the present embodiment, the present invention is applied to a light-emitting device, but the present invention is applicable not only to semiconductor light-emitting devices, but also widely to all semiconductor devices in which strong forces are applied to the electrodes, such as the bonding pads, etc., when bonded.

As shown in FIG. 1, a guide layer 12 is formed on a substrate 10 of InP. An MQW light absorption layer 14a and a MQW active layer 14b are formed on the guide layer 12. A clad layer 16 is formed on the MQW light absorption layer 14a and the MQW active layer 14b. A clad layer 17 is formed on the clad layer 16. A cap layer 18a, 18b is formed on the clad layer 17. The cap layer 18a, 18b is absent in an isolation region 22 and isolated from each other in the isolation region 22. An electrode 8 of an Au/Ge/Au film is formed on the back side of the substrate 10.

The cap layer 18a, 18b, the clad layers 17, 16, the MQW active layer 14b, the MQW light absorption layer 14a, the guide layer 12 and the substrate 10 are mesa-etched, and a mesa-shaped waveguide is formed. A high-resistance buried layer 30 of InP is formed on both sides of the mesa-shaped waveguide.

A silicon oxide film 32 is formed on the high-resistance buried layer 30. The silicon oxide film 32 is formed also on the clad layer 17 in the isolation region 22.

Electrodes 24a, 24b of an Au/Pt/Ti film are formed respectively on the cap layer 18a, 18b. The electrodes 24a, 24b are absent in the isolation region 22. Accordingly, a modulator region 26 and a DFB (Distributed FeedBack) laser region 28 are electrically isolated from each other by the isolation region 22.

In the modulator region 26 there are formed polyimide layers 36, 40 and a silicon nitride film 38 which will be described later. A bonding pad 24c is formed on the polyimide layers 36, 40 and the silicon nitride film 38. The bonding pad 24c is connected to the electrode 24a. Because of the polyimide layer 36, etc., which are formed thick, a parasitic capacity between the bonding pad 24c and the lower layer can be small, which allows modulation radio-frequencies to be used.

In the DFB laser region 2B, a bonding pad 24d is formed on the silicon oxide film 32. The bonding pad 24d is connected to the electrode 24b. No radio-frequency signal is used in the DFB laser region 28, and it is not necessary to consider a parasitic capacity between the bonding pad 24d and the lower layer.

Then, a structure of the vicinity of the bonding pad 24c of the modulate region 26 will be explained with reference to FIG. 2. FIG. 2A is a sectional view of the vicinity of the bonding pad 24c and specifically a sectional view of the vicinity along the line A—A' in FIG. 1. FIG. 2B is a plan view of the vicinity of the bonding pad 24c.

As shown in FIG. 2A, the high-resistance buried layer 30 is formed on the substrate 10. A 300 nm-thickness silicon oxide film 32 is formed on the high-resistance buried layer 30. A 200 nm-thickness silicon nitride film 34 is formed on the silicon oxide film 32.

The polyimide layer 36 is formed in a plurality of cylindrical patterns on the silicon nitride film 34. The cylindrical polyimide layer 36 may have, e.g., a 2 μm-height. In the present embodiment the polyimide layer 36 is used because the polyimide layer 36 is not damaged by impacts of the bonding, etc. because of its high flexibility. In a case that a layer, as of silicon oxide film or others, having low flexibility is formed thick below the bonding pad 24c, the silicon oxide film or others is damaged by impacts of the bonding because of its low flexibility.

The silicon nitride film 34 is formed in a 300 nm-thickness on the entire surface of the silicon nitride film 34 with the polyimide layer 36 formed in a plurality of cylindrical patterns formed on. The silicon nitride film 38 is formed on the sides of the cylindrical patterns of the polyimide layer 36. The silicon nitride film 38, the hardness of which is higher than that of polyimide, can keep the polyimide layer 36 from being distorted even when a strong force is applied to the bonding pad 24c by the bonding. The silicon nitride film 38, the hardness of which is high, is formed to be as thin as 300 nm and is never damaged by impacts of the bonding.

The polyimide layer 40 is further formed on the silicon nitride film 38. The polyimide layer 40 is as thin as, e.g., about 100 nm above the cylindrical polyimide layer 36. A silicon nitride film 42 is formed on the entire surface of the polyimide layer 40, and the bonding pad 24c is formed on the silicon nitride film 42.

As described above, according to the present embodiment, the silicon nitride film 38, the hardness of which is high, is formed on the sides of the polyimide layer 36 formed in a plurality of cylindrical patterns can prevent the polyimide layer 36 from being distorted even when a strong force is applied to the bonding pad 24c upon the bonding. Because of the polyimide layers 36, 40 formed thick below the bonding pad 24c, a parasitic capacity between the bonding pad 24c and the lower layer can be small, which permits modulation radio-frequencies to be used, whereby according to the present embodiment, a semiconductor light-emitting device using modulation radio-frequencies can be provided.

Process for Fabricating the Semiconductor Light-emitting Device

Then, the process for fabricating the semiconductor light-emitting device according to the present embodiment will be explained with reference to FIGS. 3A to 5.

First, the guide layer 12, the MQW light absorption layer 14a, the MQW active layer 14b, the clad layer 16, the clad layer 17 and the cap layer 18a, 18b are sequentially formed on a substrate 10 of InP.

Next, the cap layer 18a, 18b, the clad layers 17, 16, the MQW active layer 14b, the MQW light absorption layer 14a, the guide layer 12 and the substrate 10 are mesa-etched. Then, the high resistance buried layer 30 of InP is formed on both sides of the mesa.

Next, the cap layer 18a, 18b is patterned to be isolated by the isolation region 22.

Then, the silicon oxide film 32 of a 300 nm-thickness is formed on the entire surface by CVD (Chemical Vapor Deposition). Then, the silicon nitride film 34 of a 200 nm-thickness is formed on the silicon oxide film 32 by CVD.

Next, the polyimide layer 36 is formed on the entire surface of the silicon nitride film 34 by spin coating. Next, the polyimide layer 36 is solidified by a heat treatment of about 400° C. Thus the polyimide layer 36 of an about 2 $\mu$m-thickness is formed (see FIG. 3A).

Then, the polyimide layer 36 is patterned into cylindrical patterns by photolithography. A diameter of the cylinders may be, e.g., 5 $\mu$m, and an interval between each cylinder and its adjacent one may be, e.g., 10 $\mu$m. The polyimide layer 36 may be patterned by, dry etching using plasma discharge. An etching gas may be a mixed gas of $CF_4$ gas and $O_2$ gas. One hundred, for example, cylinders of the polyimide layer 36 are formed in a 100 $\mu$m×100 $\mu$m area near the bonding pad 24c (see FIG. 3B).

Figure 4A:
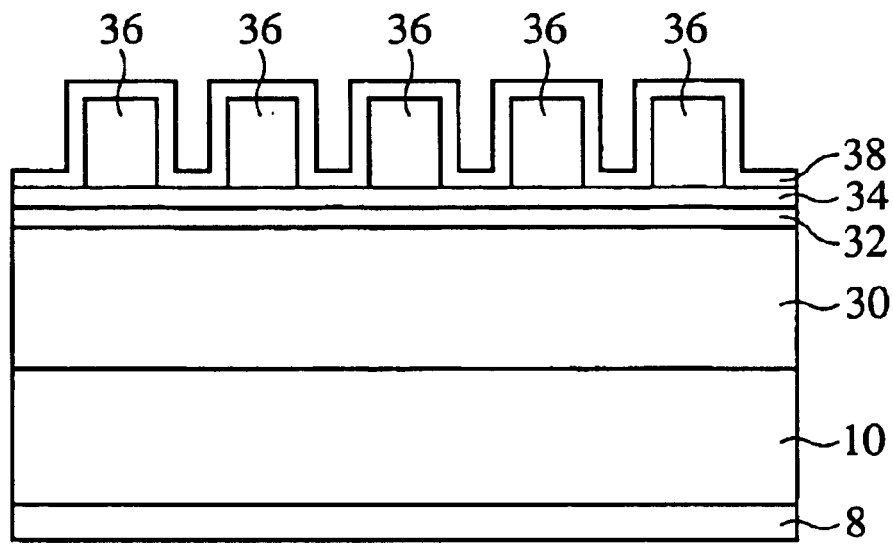
FIGS. 4A and 4B are sectional views of the semiconductor light-emitting device according to the first embodiment of the present invention in the steps of the process for fabricating the same, which show the process (Part 2).
Figure 4B:
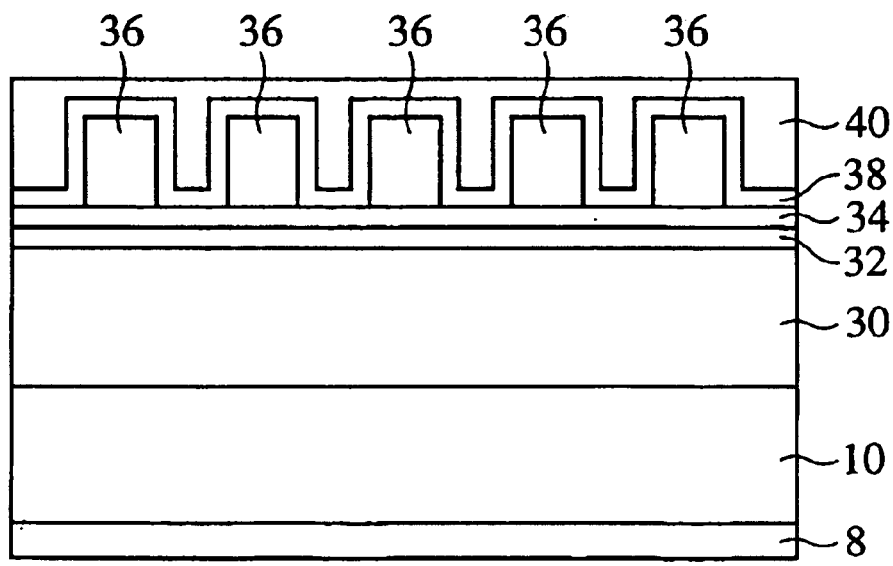

Then, the silicon nitride film 38 is formed on the entire surface in a 300 nm-thickness by CVD (see FIG. 4A).

Then, the polyimide layer 40 is formed on the entire surface by spin coating. In the present embodiment the polyimide layer 36 is formed in cylinders, which makes it difficult for the surface of the polyimide layer 40 to be uneven when the polyimide layer 40 is formed. The polyimide layer 40 can have the surface evened. Then, a heat treatment of about 400° C. to solidify the polyimide layer 40. The polyimide layer 40 has an about 100 nm-thickness on the polyimide layer 36 in cylinders (see FIG. 4B).

Then, the silicon nitride film 42 is formed on the entire surface in a 200 nm-thickness by CVD.

Next, an opening which reaches the cap layers 18a, 18b (see FIG. 1) are formed. The opening is for connecting the electrodes 24a, 24c to the cap layer 18a, 18b.

Figure 5:
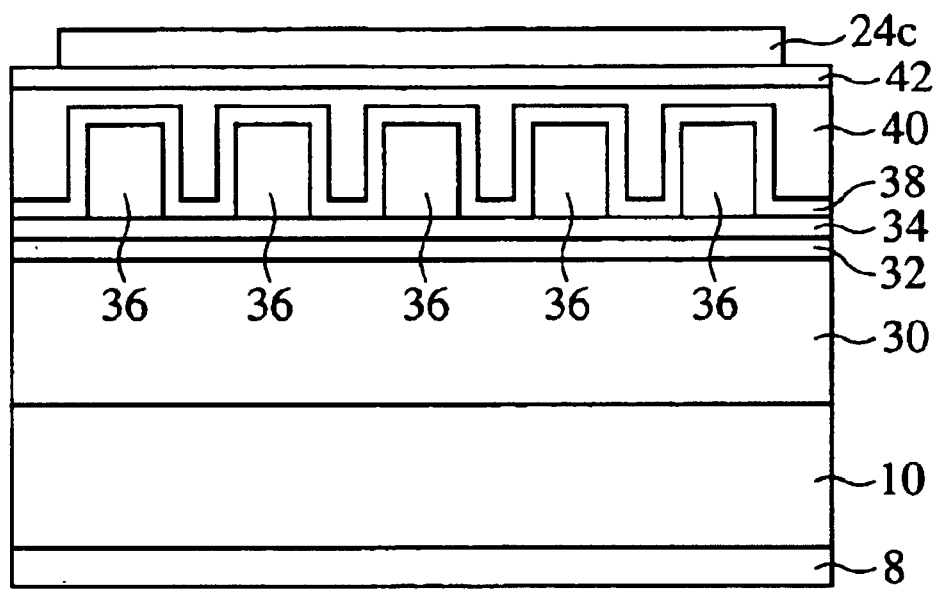
FIG. 5 is a sectional view of the semiconductor light-emitting device according to the first embodiment of the present invention in the steps of the process for fabricating the same, which shows the process (Part 3).

Then, as shown in FIG. 5, a 100 nm-thickness Ti film, a 70 nm-thickness Pt film and a 500 nm-thickness Au film are sequentially formed on the silicon nitride film 42 by vapor deposition to form the electrodes 24a, 24b and the bonding pads 24c, 24d of the Au/Pt/Ti film. Thus, the semiconductor light-emitting device according to the present embodiment is fabricated (see FIG. 5).

(A First Modification)

Figure 6A:
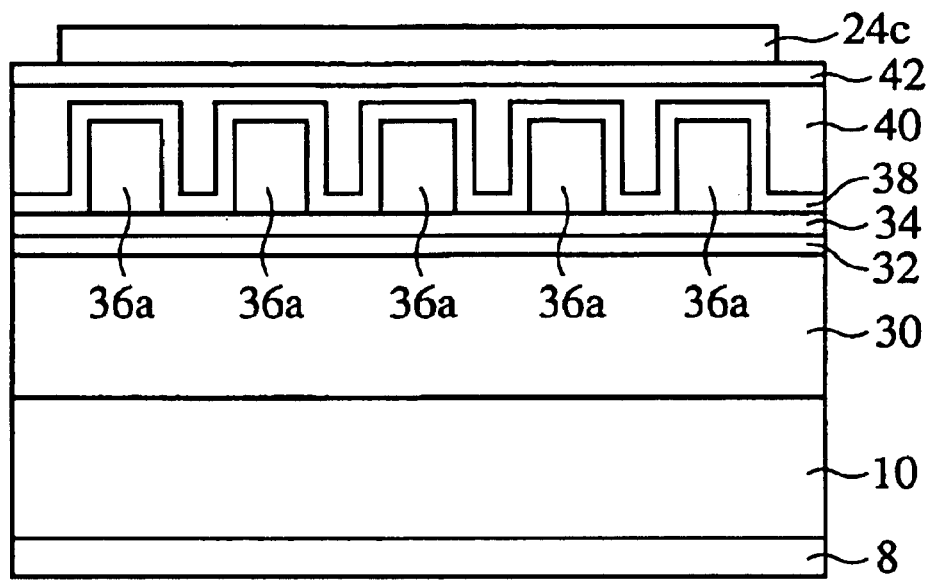
FIG. 6A is a sectional view of the semiconductor light-emitting device according to a first modification of the first embodiment of the present invention, which shows a vicinity of the bonding pad.
Figure 6B:
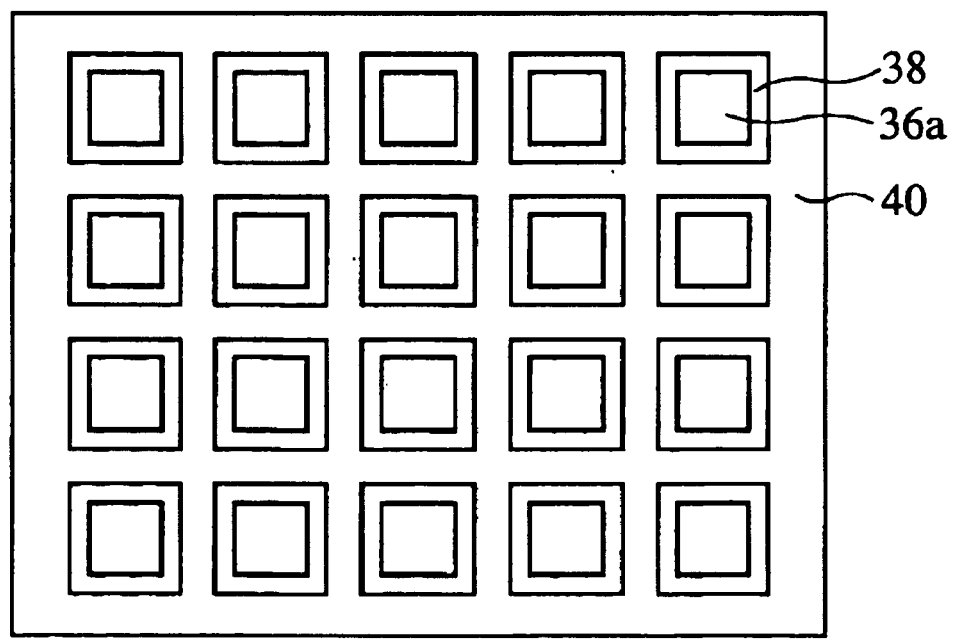
FIG. 6B is a plan view of the semiconductor light-emitting device according to a first modification of the first embodiment of the present invention, which shows a vicinity of the bonding pad.

Then, a first modification of the semiconductor light-emitting device according to the present embodiment will be explained with reference to FIGS. 6A and 6B. FIG. 6A is a sectional view of the vicinity of the bonding pad. FIG. 6B is a plan view of the vicinity of the bonding pad of the semiconductor light-emitting device according to the present modification. In FIG. 6B some constituent members are omitted.

As shown in FIGS. 6A and 6B, the semiconductor light-emitting device according to the present modification is characterized mainly in that the polyimide layer 36a is formed in quadrangular poles.

In the present modification, when the polyimide layer 36a is patterned, square patterns may be formed. In the semiconductor light-emitting device according to the present embodiment shown in FIG. 2 wherein the polyimide layer 36 is formed in cylinders, it is necessary to form circular patterns and etch the polyimide layer 36, but simply in the present modification quadrangular patterns may be formed. In consideration of achievement of pattern drawing apparatuses it is difficult to form micronized circular patterns, but it is easy to form micronized quadrangular patterns.

Thus, the semiconductor light-emitting device according to the present modification can be micronized.

(A Second Modification)

Figure 7A:
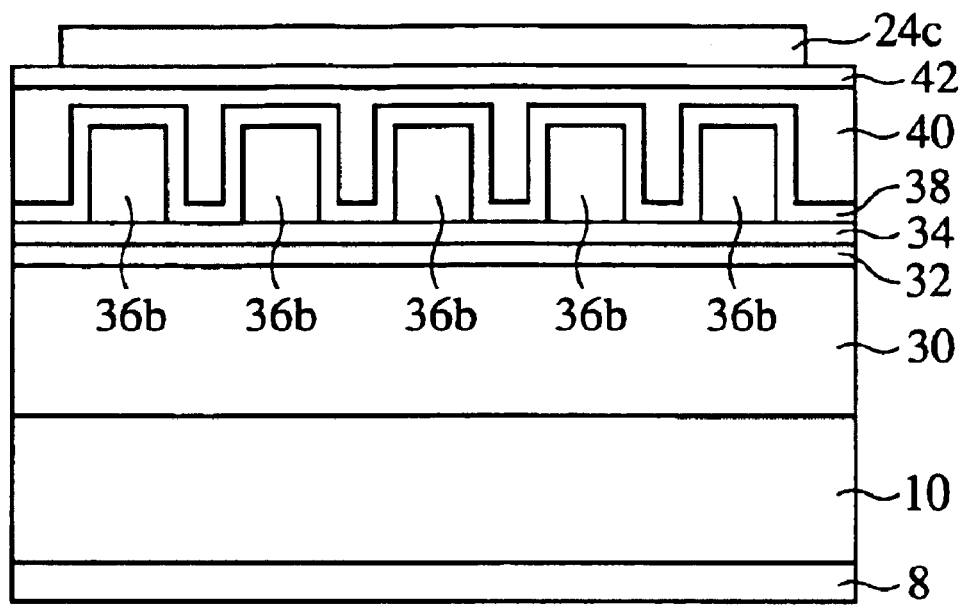
FIG. 7A is a sectional view of the semiconductor light-emitting device according to a second modification of the first embodiment of the present invention, which shows a vicinity of the bonding pad.
Figure 7B:
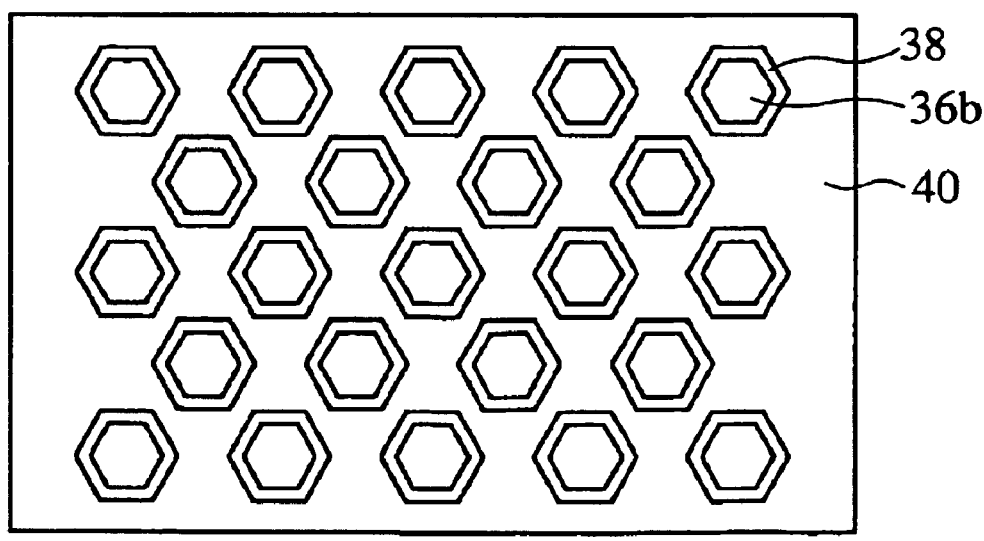
FIG. 7B is a plan view of the semiconductor light-emitting device according to a second modification of the first embodiment of the present invention, which shows a vicinity of the bonding pad.

Then, a second modification of the semiconductor light-emitting device according to the present embodiment will be explained with reference to FIGS. 7A and 7B. FIG. 7A is a sectional view of the vicinity of the bonding pad of the semiconductor light-emitting device according to the present modification. FIG. 7B is a plan view of the vicinity of the bonding pad of the semiconductor light-emitting device according to the present modification. In FIG. 7B some constituent members are omitted.

As shown in FIG. 7A, the semiconductor light-emitting device according to the present modification is characterized mainly in that the polyimide layer 36 is formed in hexagonal poles.

In the present modification, because the polyimide layer 36b is formed in hexagonal poles, the sections of the silicon nitride film 38 along the substrate 10 are hexagonal. According to the present modification, the silicon nitride film 38 can have higher resistance to a force applied by the bonding.

A Second Embodiment

Figure 8A:
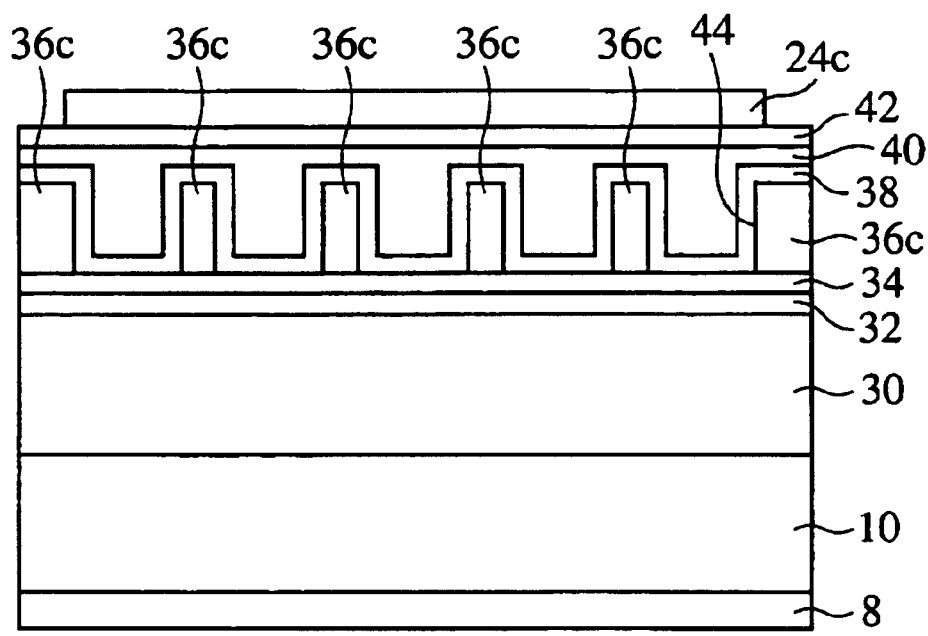
FIG. 8A is a sectional view of the semiconductor light-emitting device according to the second embodiment of the present invention, which shows a vicinity of the bonding pad.
Figure 8B:
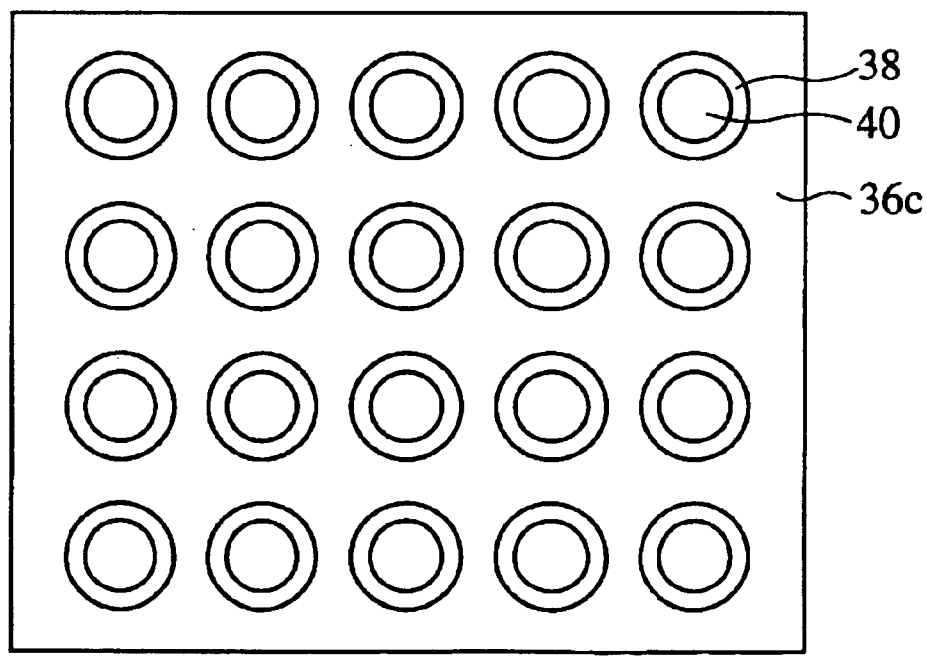
FIG. 8B is a plan view of the semiconductor light-emitting device according to the second embodiment of the present invention, which shows a vicinity of the bonding pad.
Figure 9A:
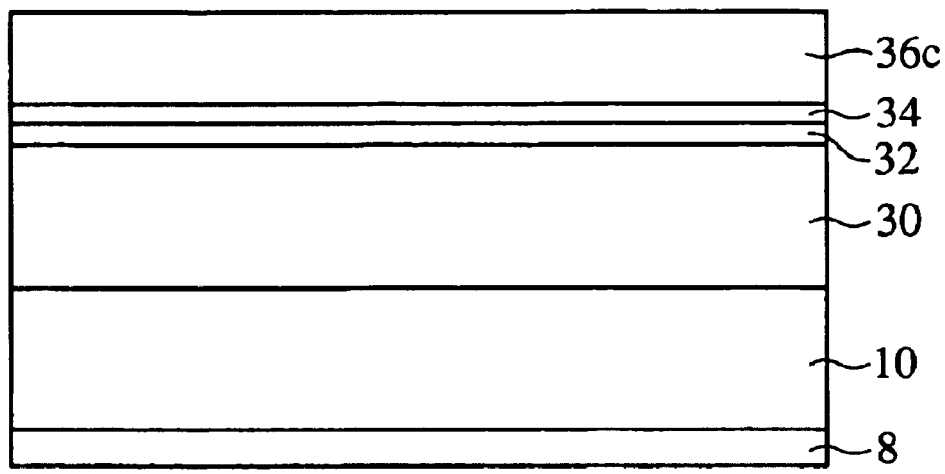
FIGS. 9A and 9B are sectional views of the semiconductor light-emitting device according to the second embodiment of the present invention in the steps of the process for fabricating the same, which show the process (Part 1).
Figure 9B:
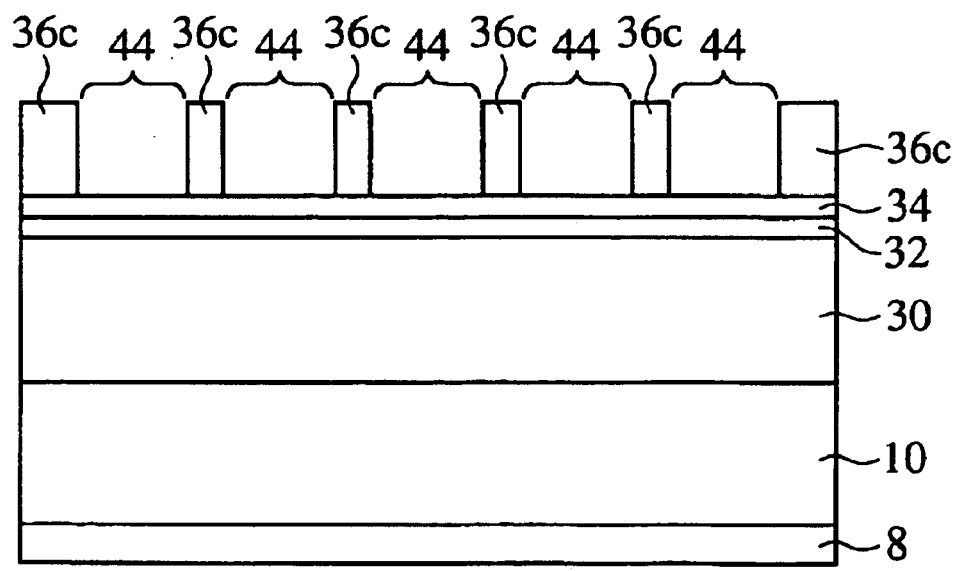

The semiconductor light-emitting device according to a second embodiment of the present invention and the process for fabricating the same will be explained with reference to FIGS. 8A to 11. FIG. 8A is a sectional view of a vicinity of bonding pad of the semiconductor light-emitting device according to the present embodiment. FIG. 8B is a plan view of a vicinity of bonding pad of the semiconductor light-emitting device according to the present embodiment. FIGS. 9A to 11 are sectional views of the semiconductor light-emitting device according to the present embodiment in the steps of the process for fabricating the same, which show the process. The same members of the present embodiment as those of the semiconductor light-emitting device according to the first embodiment and the process for fabricating the same shown in FIGS. 1 to 7B are represented by the same reference numbers not to repeat or to simplify their explanation.

The semiconductor light-emitting device according to the present embodiment is characterized mainly in that silicon nitride film 38 is formed on the inside walls of openings formed in a polyimide layer 36c.

As shown in FIG. 8A, a plurality of the openings 44 which reach the silicon nitride film 34 are formed in the polyimide layer 36c. A sectional shape of the openings 44 along a substrate 10 is circular.

The silicon nitride film 38 is formed on the entire surface of the polyimide layer 36c with the openings 44 thus formed in. The silicon nitride film 38 is formed also on the inside walls of the openings 44. Because the silicon nitride film 38 is formed on the inside walls of the openings 44, even when a strong force is applied to the bonding pad 24c, the polyimide layer 36c is prevented from being distorted.

A polyimide layer 40 is formed on the entire surface of the silicon nitride film 38. The polyimide layer 40 is buried in the openings 44 with the silicon nitride film 38 formed on. On the polyimide layer 40 there are sequentially formed a silicon nitride film 42 and a bonding pad 24c.

As described above, according to the present embodiment, because the silicon nitride film 38, the hardness of which is high, is formed on the inside walls of a plurality of openings 44 formed in the polyimide layer 36c, even when a strong force is applied to the bonding pad 24c by the bonding, the polyimide layer 36c is prevented from being distorted, whereby peeling of the bonding pad 24c can be prevented. Because of the thick polyimide layers 36c, 40 formed below the bonding pad 24c, a parasitic capacity between the bonding pad 24c and the lower layer can be small, whereby radio-frequency signals can be used as the modulation signals. Thus, the semiconductor light-emitting device according to the present embodiment can have modulation radio-frequencies.

(Process for Fabricating the Semiconductor Light-emitting Device)

Then, the process for fabricating the semiconductor light-emitting device according to the present embodiment will be explained with reference to FIGS. 9A to 11.

Figure 3A:
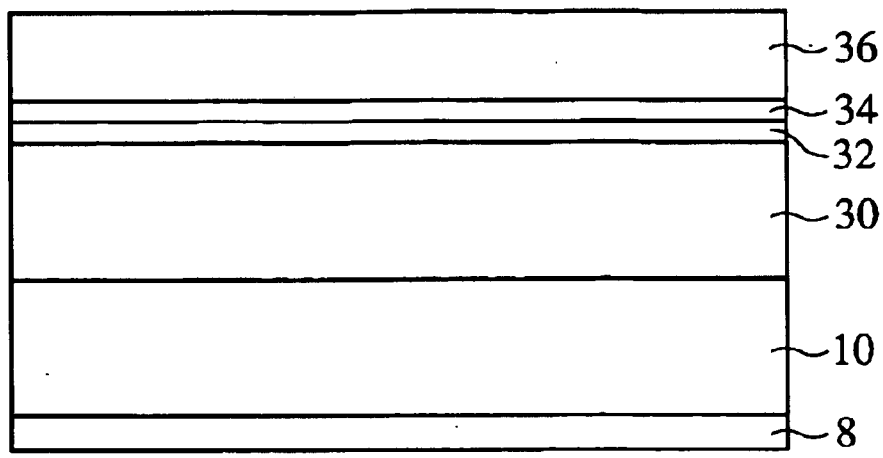
FIGS. 3A and 3B are sectional views of the semiconductor light-emitting device according to the first embodiment of the present invention in the steps of the process for fabricating the same, which show the process (Part 1).
Figure 3B:
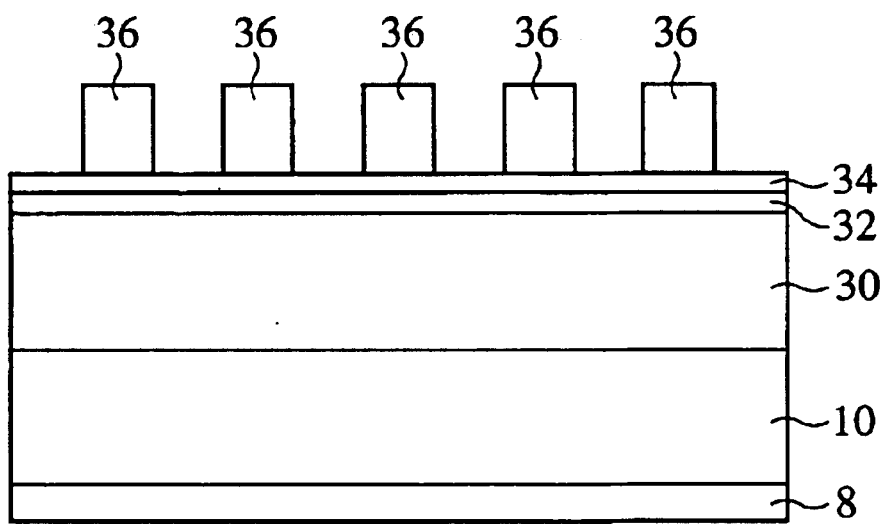

The step of forming the silicon nitride film 34 and the steps up to the silicon nitride film forming step are the same as those of the process for fabricating the semiconductor light-emitting device according to the first embodiment shown in FIG. 3A, and are not explained here.

Following step of forming the silicon nitride film 34, the polyimide layer 36c is formed on the entire surface of the silicon nitride film 34 by spin coating. Then an about 400° C. heat treatment is performed to solidify the polyimide layer 36c. Thus the polyimide layer 36c of an about 2 µm thickness is formed (see FIG. 9A).

Then the openings 44 which reach the silicon nitride film 34 are formed in the polyimide layer 36c by photolithography. A diameter of the openings 44 may be, e.g., 5 µm and may be spaced from each other by, e.g., 15 µm. The openings 44 in the polyimide layer 36c may be formed by, e.g., dry etching using plasma discharges. An etching gas may be a mixed gas of $CF_4$ gas and $O_2$ gas. Thus, 49 openings, for example, are formed, e.g., a 100 µm×100 µm range near the bonding pad 24c (see FIG. 9B). Preferably large openings 44 are formed in consideration of a surface tension of the polyimide so that the polyimide can intrudes without failure into the openings 44 in a later step.

Figure 10A:
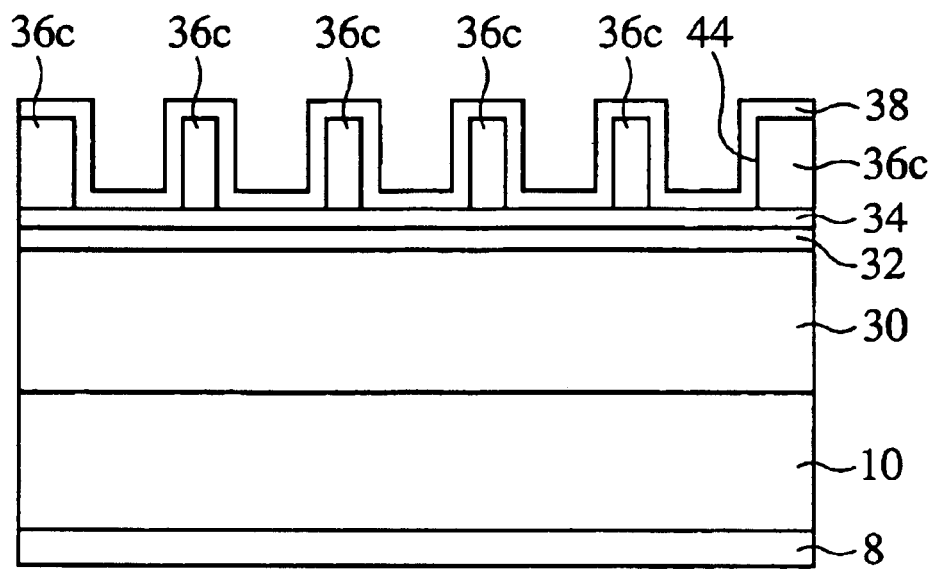
FIGS. 10A and 10B are sectional views of the semiconductor light-emitting device according to the second embodiment of the present invention in the steps of the process for fabricating the same, which show the process (Part 2).

Then, the silicon nitride film 38 is formed in a 300 nm thickness on the entire surface by CVD (see FIG. 10A).

Figure 10B:
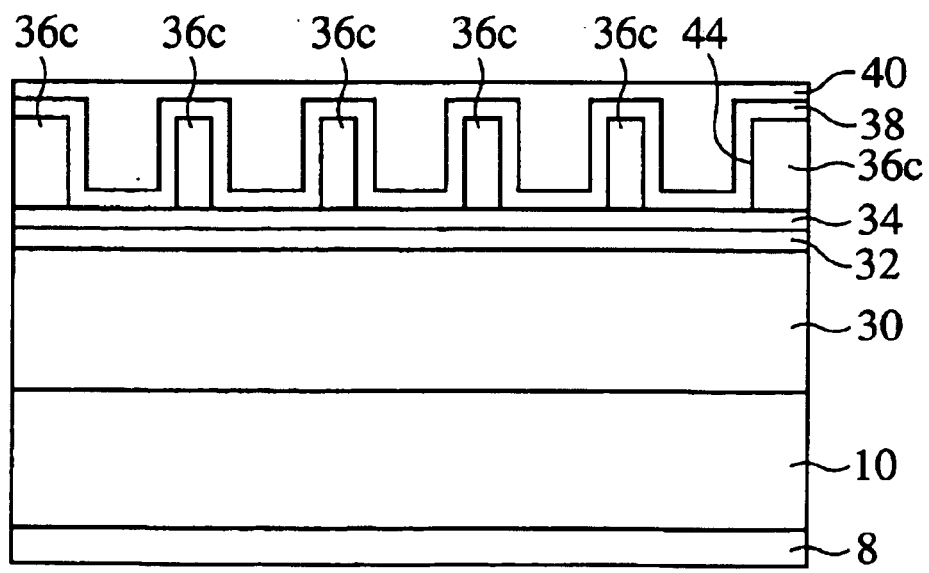
Figure 11:
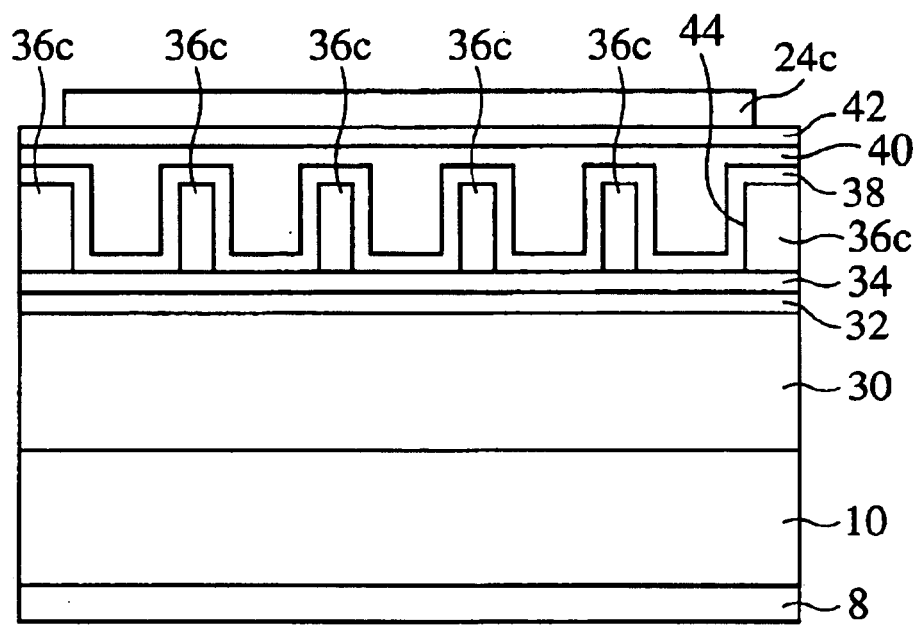
FIG. 11 is sectional views of the semiconductor light-emitting device according to the second embodiment of the present invention in the steps of the process for fabricating the same, which shows the process (Part 3).

Then, the polyimide layer 40 is formed on the entire surface by spin coating, and the polyimide layer 40 is buried in the openings 44 with the silicon nitride film 38 formed in. The polyimide layer 40 on the polyimide layer 36c is below, e.g., 300 nm. Then, a heat treatment of about 400° C. is performed to solidify the polyimide layer 40 (FIG. 10B).

Then, the silicon nitride film 42 is formed in a 200 nm thickness on the entire surface by CVD.

Next, an opening which reaches the cap layers 18a, 18b (see FIG. 1) is formed. The opening is for connecting electrodes 24a, 24b to the cap layer 18a, 18b.

Then, the electrodes 24a, 24b of an Au/Pt/Ti film and the bonding pads 24c, 24d are formed on the silicon nitride film 42 by vapor deposition in the same way as in the first embodiment. Thus, the semiconductor light-emitting device according to the present embodiment is fabricated.

(A First Modification)

Figure 12A:
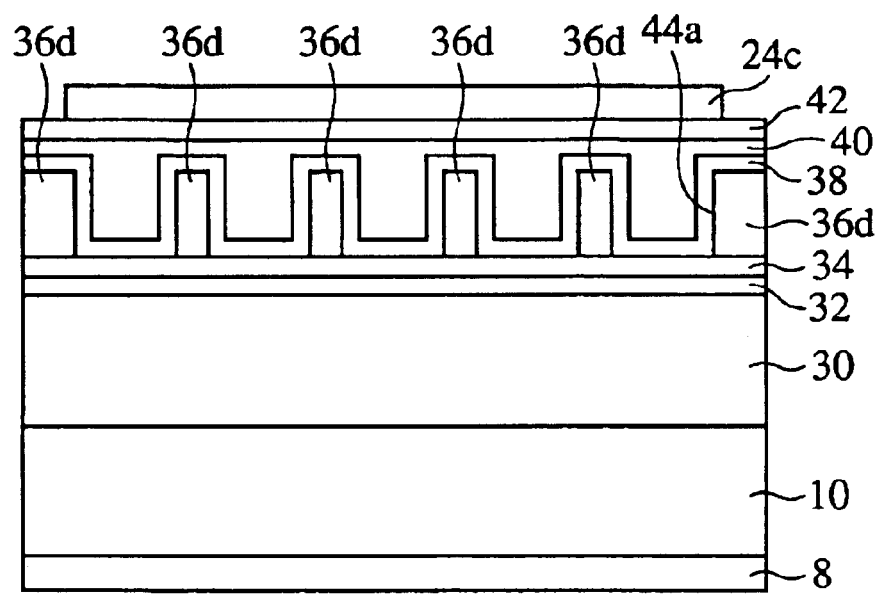
FIG. 12A is a sectional view of the semiconductor light-emitting device according to a first modification of the second embodiment of the present invention, which shows a vicinity of the bonding pad.
Figure 12B:
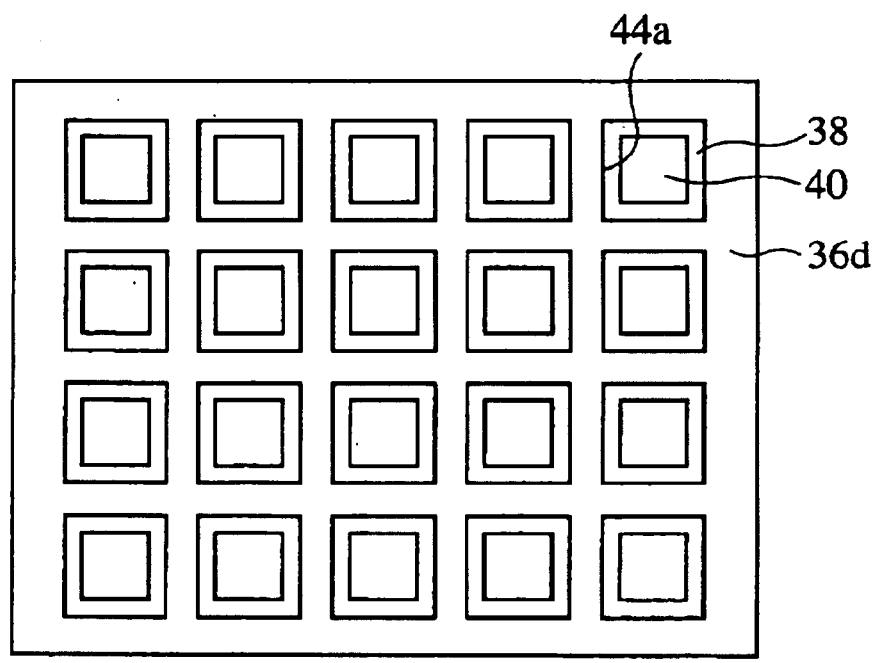
FIG. 12B is a plan view of the semiconductor light-emitting device according to a first modification of the second embodiment of the present invention, which shows a vicinity of the bonding pad.

Then, the semiconductor light-emitting device according to a first modification of the present embodiment will be explained with reference to FIGS. 12A and 12B. FIG. 12A is a sectional view of a vicinity of the bonding pad of the semiconductor light-emitting device according to the present modification. FIG. 12B is a plan view of the vicinity of the bonding pad of the semiconductor light-emitting device according to the present modification.

The semiconductor light-emitting device according to the present modification is characterized in that the openings 44a are quadrangular.

In the present modification, when the polyimide layer 36d is patterned, quadrangular patterns may be formed. In the semiconductor light-emitting device according to the present embodiment shown in FIG. 8 wherein the polyimide layer 36c is formed in cylinders, it is necessary to form circular patterns and etch the polyimide layer 36c, but simply in the present modification quadrangular patterns may be formed. In consideration of achievement of pattern drawing apparatuses it is difficult to form micronized circular patterns, but it is easy to form micronized quadrangular patterns.

Thus, the semiconductor light-emitting device according to the present modification can be micronized.

(A Second Modification)

Figure 13:
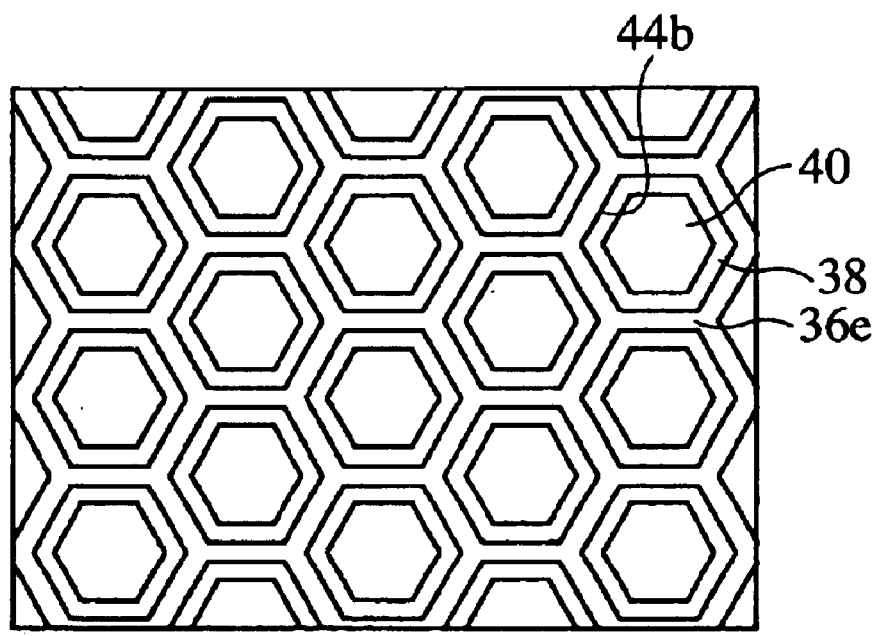
FIG. 13 is a plan view of the semiconductor light-emitting device according to a second modification of the second embodiment of the present invention, which shows a vicinity of the bonding pad.
Figure 14:
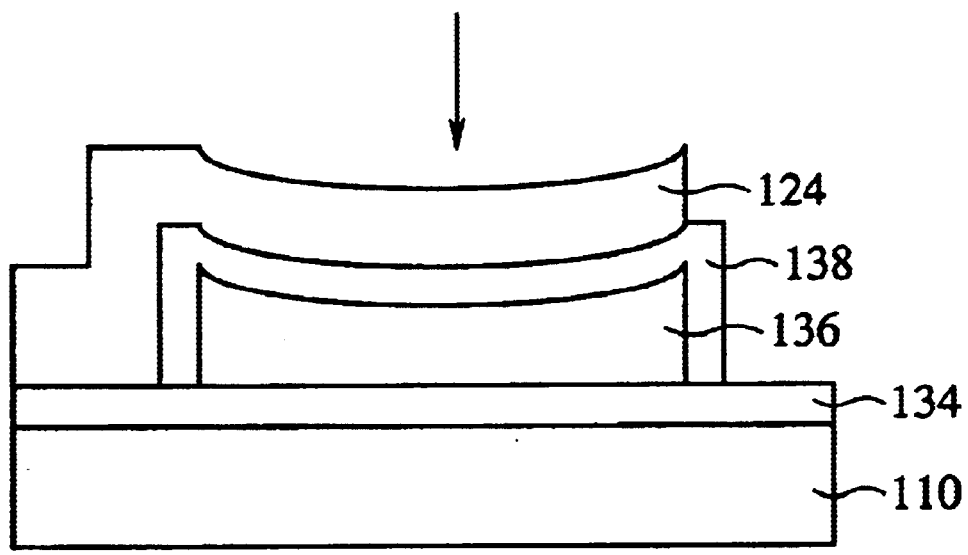
FIG. 14 is a conceptual view showing distortion of the polyimide layer upon the bonding.

Then, the semiconductor light-emitting device according to a second modification of the present embodiment will be explained with reference to FIG. 13. FIG. 13 is a plan view of the vicinity of the bonding pad of the semiconductor light-emitting device according to the present modification. In FIG. 13 some members are not shown.

As shown in FIG. 13, the semiconductor light-emitting device according to the present modification is characterized mainly in that the openings 44b are formed in hexagonal poles.

In the present modification the openings 44b are formed in hexagonal poles, and the sections of the silicon nitride film 38 along the substrate 10 are hexagonal. Accordingly the silicon nitride film 38 can have higher resistance to a force applied by the bonding.

Modifications

The present intention is not limited to the above-described embodiment and can cover various modifications.

For example, in the first and the second embodiments the silicon nitride film 38 is formed on the entire surface, but the silicon nitride film 38 may be formed at least on the side walls of the polyimide layers 36 to 36e. The silicon nitride film 38 may be formed at least on the side walls of the polyimide layers 36 to 36e, whereby the polyimide layers 36 to 36e are prevented from being distorted upon the bonding.

A film formed on the side walls of the polyimide layers 36 to 36b is silicon nitride film in the first embodiment but is not essentially silicon nitride film. The film may be any film having high hardness, e.g., a silicon oxide film, an aluminum oxide film, a polysilicon film or others, as long as the film can prevent from the polyimide layers 36 to 36b from being distorted upon the bonding.

In the second embodiment, silicon nitride film is unessentially formed on the inside walls of the openings 44 to 44b, but is not essential. Any film having high hardness, such as silicon oxide film, aluminum oxide film, polysilicon film or others, may be formed as long as the film can prevent the polyimide layers 36c to 36e from being distorted upon the bonding.

The first and the second embodiments have been explained by means of the semiconductor light-emitting device including the modulator region and the DFB laser region isolated from each other. The present invention may be applicable to a semiconductor light-emitting device including the modulator region which is not isolated. In such case the above-described polyimide layers are formed below the bonding pad formed in the DFB laser region.

In the first and the second embodiments polyimide layers are formed below the bonding pad, but the present invention is applicable to a case wherein polyimide layer is formed below electrodes for flip chip bonding in place of the bonding pad. In this case the electrodes may be formed not only on a part of the substrate but also on the entire surface, and the above-described polyimide layers may be formed below the electrode formed on the entire surface.

What is claimed is:

1. An electrode structure including a bonding pad formed on an insulation film without penetrating the insulation film, the insulation film being formed above a base structure, the insulation film comprising a plurality of poles of polyimide, a first film formed on each side surfaces of the poles and formed of an insulation material having a higher hardness than polyimide, and a second film of polyimide buried among said a plurality of poles with the first film formed on the side surface thereof, wherein said plurality of poles are surrounded with the first film respectively.

2. An electrode structure according to claim 1, wherein the first film is also formed on upper surfaces of the poles.

3. An electrode structure according to claim 1, wherein the first film is also formed on upper surfaces of the second film.

4. A semiconductor light-emitting device having a waveguide including an active layer or a light absorption layer, a lower electrode formed below the waveguide, and an upper electrode formed above the waveguide, the upper electrode having an electrode structure, the electrode structure including a bonding pad formed on an insulation film without penetrating the insulation film, the insulation film being formed above a base substrate, the insulation film comprising a plurality of poles of polyimide, a first film formed on each side surfaces of the poles and formed of an insulation material having a higher hardness than polyimide, and a second film of polyimide buried among said a plurality of poles with the first film formed on side surfaces thereof.

5. A semiconductor light-emitting device according to claim 4, wherein the first film is also formed on upper surfaces of the poles.

6. A semiconductor light-emitting device according to claim 4, wherein the first film is also formed on upper surfaces of the second film.

7. A semiconductor light-emitting device according to claim 4, wherein a third film of an insulation material is sandwiched between the insulation film and the bonding pad.

8. A semiconductor light-emitting device according to claim 4, wherein the insulation film is formed on a layer formed on the base substrate, the layer being formed of a material having a higher hardness than the polyimide.

9. A semiconductor light-emitting device according to claim 4, further comprising a high resistance layer formed on a side of the waveguide; and said electrode structure formed on the high resistance layer.

10. A semiconductor light-emitting device according to claim 4, wherein the first is also formed on upper surfaces of the poles.

11. A semiconductor light-emitting device according to claim 4, wherein the first film is also formed on upper surfaces of the second film.

* * * * *